United States Patent
Koe et al.

(10) Patent No.: US 7,312,738 B2
(45) Date of Patent: Dec. 25, 2007

(54) APPARATUS AND METHOD FOR SIGMA DELTA SIGNAL TREATMENT

(75) Inventors: Wern Ming Koe, Dallas, TX (US); Yong-In Park, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/260,103

(22) Filed: Oct. 27, 2005

(65) Prior Publication Data

US 2007/0096962 A1    May 3, 2007

(51) Int. Cl.
*H03M 3/00* (2006.01)
(52) U.S. Cl. .................. 341/143; 341/157
(58) Field of Classification Search ......... 341/143–170
See application file for complete search history.

(56) References Cited

U.S. PATENT DOCUMENTS

| | | | | |
|---|---|---|---|---|
| 5,963,160 A * | 10/1999 | Wilson et al. | ............... | 341/143 |
| 6,362,762 B1 * | 3/2002 | Jensen et al. | ............... | 341/143 |
| 6,570,519 B1 * | 5/2003 | Yang | ........................ | 341/143 |
| 6,621,435 B2 * | 9/2003 | Cusinato et al. | ............ | 341/143 |
| 6,650,124 B2 * | 11/2003 | Roeck | ........................ | 324/614 |
| 6,831,986 B2 * | 12/2004 | Kates | ........................ | 381/312 |

OTHER PUBLICATIONS

"A 100dB 2.5MS/s Output Data Rate Delta-Sigma ADC";R. Brewer, J. Gorbold, P. Hurrell, C. Lyden, R. Maurino and M. Vickery; 2005 IEEE International Solid-State Circuits Conference; Feb. 8, 2005.

* cited by examiner

*Primary Examiner*—Rexford Barnie
*Assistant Examiner*—Lam T. Mai
(74) *Attorney, Agent, or Firm*—Wade J. Brady, III; Frederick J. Telecky, Jr.

(57) ABSTRACT

A sigma delta signal treating apparatus includes: (a) a low pass filtered signal path including at least one low pass filter; and (b) a quantization noise filtered signal path coupled with the low pass filtered signal path; the quantization noise filtered signal path including at least one high pass filter and at least one feedback notch filter.

11 Claims, 5 Drawing Sheets

APPARATUS AND METHOD FOR SIGMA DELTA SIGNAL TREATMENT

BACKGROUND OF THE INVENTION

The present invention is directed to electrical modulating circuits, and especially to sigma delta modulating circuits employed for analog-to-digital signal conversion to present a digital output signal representative of an analog input signal.

By way of example and not by way of limitation, a sigma delta signal treating apparatus shall be described herein employing a representative circuitry referred to as a sigma delta converter. Sigma delta converters employ two principles in effecting analog-to-digital conversion of signals to present a digital output signal representative of an analog input signal: oversampling and noise shaping. Oversampling spreads quantization noise power over a bandwidth substantially equal to the sampling frequency, which is much greater than the signal bandwidth of the input analog signal. A modulator is employed in a sigma delta converter apparatus to effect low pass filtering of the analog input signal and to operate as a high pass filter of noise, thus "shaping" the quantization noise so that most of the noise energy will be higher than the signal bandwidth, also referred to as the band of interest. A subsequent digital low pass filtering stage substantially reduces out-of-band quantization noise, and final downsampling with a decimation filter brings the sampled signal to the Nyquist rate.

In high speed, or wideband sigma delta converter apparatuses using a higher oversampling ratio (OSR), the noise floor (i.e., a noise level which is substantially irreducible) is dominated by thermal noise that the input sampling circuit may generate while operating at a lower OSR. As the OSR rises or as the band of interest includes higher frequencies, the high frequency portion of the high-pass-shaped quantization noise begins to rise above the thermal noise floor and affects the overall signal-to-noise ratio (SNR) of the apparatus.

One approach to suppressing quantization noise in a sigma delta filter is described by R. Brewer, et al. in "A 100 dB SNR 2.5 MS/s Output Data Rate ΔΣ ADC"; 2005 IEEE International Solid State Circuits Conference, Session 9, Switched-Capacitor ΔΣ Modulators; Digest of Technical Papers; 2005 (hereinafter referred to as "Brewer"). Brewer discloses a ΔΣ modulator circuit having three stages and associated output circuitry. Brewer's first stage is a low pass signal transfer function stage having feed-forward topology. Brewer's second stage is a high pass noise transfer function stage having a feed-forward topology and performing noise shaping. Brewer's third stage is simply an analog-to-digital conversion unit that performs a noise shifting or lowering function without performing any noise shaping. Using a feed-forward topology involves some shortcomings, such as requiring precision of timing operations, requiring parts (e.g., amplifier units) having fast settling times to accommodate timing requirements, and other shortcomings.

The inventors recognized a need for a simpler and, therefore, less expensive, alternative to providing a sigma delta signal treatment apparatus that permits suppressing quantization noise. The inventors recognized that using a feedback topology in constructing a notch filter (referred to herein as a feedback notch filter) for use in a signal treatment apparatus, such as a sigma delta converter apparatus, is effective in relatively low noise environments. Using such a feedback notch filter requires less stringent timing criteria, less costly components and entails fewer design constraints. Using such a feedback notch filter in a relatively low noise environment is acceptable to a designer without requiring a separate stage in the apparatus for carrying out a noise lowering function.

There is a need for a simple, low cost apparatus and method for effecting sigma delta signal treatment that permits suppressing quantization noise to a level at or below white noise and thermal noise levels over an increased bandwidth than has previously been attained.

SUMMARY OF THE INVENTION

A sigma delta signal treating apparatus includes: (a) a low pass filtered signal path including at least one low pass filter; and (b) a quantization noise filtered signal path coupled with the low pass filtered signal path; the quantization noise filtered path including at least one high pass filter and at least one feedback notch filter.

A method for effecting sigma delta signal treatment includes the steps of: (a) in no particular order: (1) establishing at least one low pass filtered signal path; and (2) establishing at least one quantization noise filtered signal path coupled with the at least one low pass filtered signal path; and (b) in no particular order: (1) providing at least one low pass filter in each respective low pass filtered signal path of the at least one low pass filtered signal path; (2) providing at least one high pass filter in each respective quantization noise filtered signal path of the at least one quantization noise filtered signal path; and (3) providing at least one feedback notch filter in at least one selected quantization noise filtered signal path of the at least one quantization noise filter signal path; and (c) operating the at least one low pass filter, the at least one high pass filter and the at least one feedback notch filter cooperatively to shift a first frequency range at which total noise begins to escalatingly increase to a higher frequency than a second frequency range at which quantization noise alone begins to escalatingly increase.

It is, therefore, an object of the present invention to provide simple, low cost apparatus and method for effecting sigma delta signal treatment that permits suppressing quantization noise to a level at or below white noise and thermal noise levels over an increased bandwidth than has previously been attained.

Further objects and features of the present invention will be apparent from the following specification and claims when considered in connection with the accompanying drawings, in which like elements are labeled using like reference numerals in the various figures, illustrating the preferred embodiments of the invention.

DETAILED DESCRIPTION OF THE PREFERRED EMBODIMENT

Figure 1:
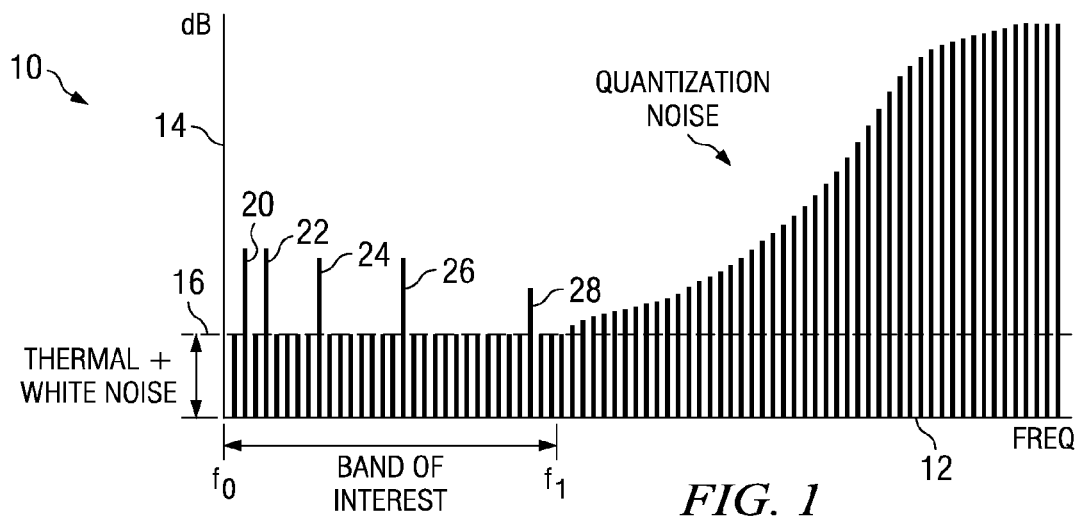
FIG. 1 is a graphic representation in the frequency domain of noise in a sigma delta signal treating apparatus.

FIG. 1 is a graphic representation in the frequency domain of noise in a sigma delta signal treating apparatus. In FIG. 1, a graphic plot 10 includes a horizontal axis 12 indicating frequency and a vertical axis 14 representing amplitude (in decibels; dB). Noise is represented by a plurality of vertical lines indicating that noise signals typically occur as sharply vertical spikes. A "floor" or minimum noise level is indicated at an amplitude level 16 representing thermal noise that an input sampling circuit may generate, plus general "white" noise otherwise generated or encountered when operating an apparatus. Thermal-plus-white noise level 16 (hereinafter referred to as "thermal noise level 16") generally represents a minimum noise level a designer must expect to be present in any sigma delta signal treating apparatus. Input signals such as analog signals indicating data are represented as being distinguishable above thermal noise level 16, as indicated at 20, 22, 24, 26, 28.

Input signals 20, 22, 24, 26, 28 are presented within a signal bandwidth $f_0$-$f_1$, also referred to as the band of interest. As mentioned earlier herein, sigma delta signal treating circuitry employs oversampling and noise shaping techniques to push quantization noise outside the band of interest of the circuitry. As a result, quantization noise that rises above thermal noise level 16 is pushed to frequencies higher than the upper limit $f_1$ of band of interest $f_0$-$f_1$.

In order to design a sigma delta signal treating apparatus having a wide band capability (that is, having a wider band of interest higher than frequency $f_1$) one must shape quantization noise to move to a higher frequency than frequency $f_1$ so that only thermal noise level 16 must be exceeded by input data signals so that the input signals may be detectable. Said another way, quantization noise must be shaped to substantially improve signal-to-noise ratio (SNR) in a desired expanded band of interest.

Figure 2:
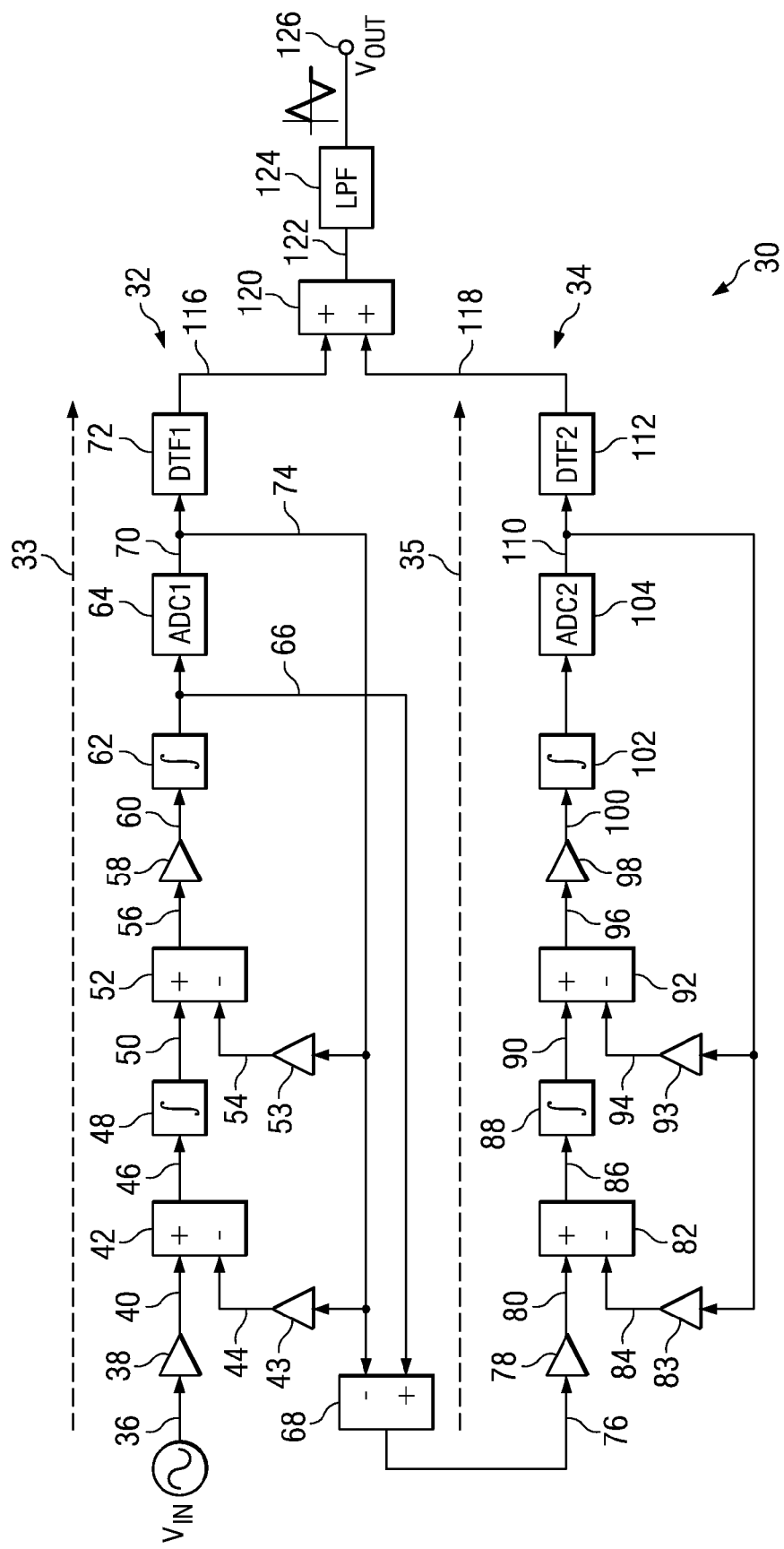
FIG. 2 is an electrical schematic diagram of a prior art sigma delta signal treating apparatus.

FIG. 2 is an electrical schematic diagram of a prior art sigma delta signal treating apparatus. In FIG. 2, a sigma delta signal treating apparatus 30 is configured as a fourth order two stage sigma delta modulator having a second order first stage 32 and a second order second stage 34. First stage 32 receives an analog input signal $V_{IN}$ at an input locus 36 to an interface unit 38. Interface unit 38 presents a treated input signal to a first input locus 40 of a first summing unit 42. First summing unit 42 sums signals received at first input locus 40 with signals received at a second inverting input locus 44 to present a first summed signal at an input locus 46 of a first integrator unit 48. First integrator unit 48 integrates signals received at input locus 46 and presents a first integrated signal to a first input locus 50 of a second summing unit 52. Second summing unit 52 sums signals received at first input locus 50 with signals received at a second inverting input locus 54 to present a second summed signal at an input locus 56 of an interface unit 58. Interface unit 58 presents a treated second summed signal to an input locus 60 of a second integrator unit 62. Second integrator unit 62 presents a second integrated signal to a first analog-to-digital converting (ADC1) unit 64 and presents the second integrated signal to a first input locus 66 of a third summing unit 68. ADC1 64 presents a first digital signal to an input locus 70 to a first digital transfer function (DTF1) unit 72. ADC1 64 also provides the first digital signal to a second inverting input locus 74 to third summing unit 68. ADC1 64 still further provides the first digital signal to second inverting input locus 44 via an interface unit 43 and provides the first digital signal to second inverting input locus 54 via an interface unit 53.

Third summing unit 68 sums signals received at first input locus 66 with signals received at a second inverting input locus 74 to present a third summed signal at an input locus 76 of an interface unit 78. Interface unit 78 presents a treated input signal to a first input locus 80 of a fourth summing unit 82. Fourth summing unit 82 sums signals received at first input locus 80 with signals received at a second inverting input locus 84 to present a fourth summed signal at an input locus 86 of a third integrator unit 88. Third integrator unit 88 integrates signals received at input locus 86 and presents a third integrated signal to a first input locus 90 of a fifth summing unit 92. Fifth summing unit 92 sums signals received at first input locus 90 with signals received at a second inverting input locus 94 to present a fifth summed signal at an input locus 96 of an interface unit 98. Interface unit 98 presents a treated fifth summed signal to an input locus 100 of a fourth integrator unit 102. Fourth integrator unit 102 presents a fourth integrated signal to a second analog-to-digital converting (ADC2) unit 104. ADC2 104 presents a second digital signal to an input locus 110 to a second digital transfer function (DTF2) unit 112. ADC2 104 also provides the second digital signal to second inverting input locus 84 via an interface unit 83 and provides the second digital signal to second inverting input locus 94 via an interface unit 93.

Digital transfer function unit 72 presents a modified first digital signal to a first input locus 116 of a sixth summing unit 120. Digital transfer function unit 112 presents a modified second digital signal to a second input locus 118 of sixth summing unit 120. Sixth summing unit 120 sums signals received at first input locus 116 with signals received at a second input locus 118 to present a sixth summed signal at a summed output locus 122. Summed output locus 122 presents a summed signal to a low pass filter unit 124. Low pass filter unit 124 presents a digital output signal at an output locus 126.

By way of example and not by way of limitation, interface units 38, 43, 53, 58, 78, 83, 93, 98, may be configured as resistor elements, capacitor elements, inductor elements or a combination of such elements or other elements. Signal treating apparatus 30 thus establishes a signal path 33 from input locus 36 via interface unit 38, summing unit 42, integrator unit 48, summing unit 52, interface unit 58, integrator unit 62, ADC1 64, DTF1 72, summing unit 120 and low pass filter unit 124 to output locus 126. ADC1 64 is a source of quantization noise. Summing unit 68 operates to present quantization noise generated by ADC1 64 to input locus 76. Thus apparatus 30 establishes a quantization noise path 35 from input locus 76 via interface unit 78, summing unit 82, integrator unit 88, summing unit 92, interface unit 98, integrator unit 102, ADC2 104, DTF2 112, summing unit 120 and low pass filter unit 124 to output locus 126. ADC2 112 is also a source of quantization noise.

Interface units 38, 43, 53, 58 and integrator units 48, 62 are preferably configured to impart a delay to signals traversing signal path 33. Interface units 78, 98, 83, 93 and integrator units 88, 102 are preferably configured to establish a high pass filtering treatment of quantization noise traversing quantization noise path 35.

Figure 3:
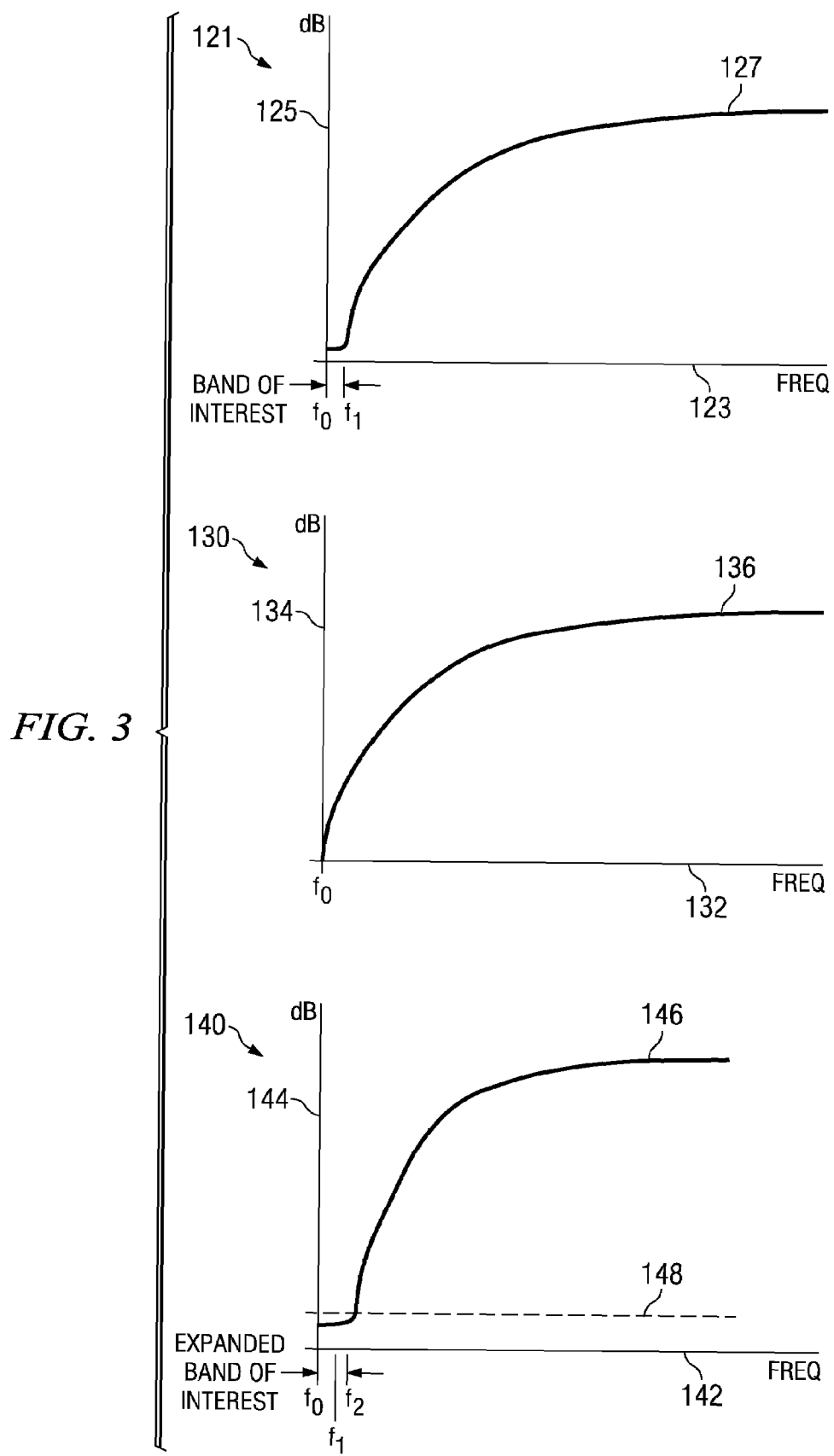
FIG. 3 is a graphic representation of various signals occurring in the prior art apparatus illustrated in FIG. 2.

FIG. 3 is a graphic representation of various signals occurring in the prior art apparatus illustrated in FIG. 2. In FIG. 3, a graphic plot 121 includes a horizontal axis 123 indicating frequency and a vertical axis 125 representing amplitude (in decibels; dB). A curve 127 represents a noise transfer function (NTF) relating to a first high pass filter in a sigma delta signal treating device, such as sigma delta signal treating apparatus 30 (FIG. 2). A signal bandwidth $f_0$-$f_1$, also referred to as the band of interest, is established by NTF 127.

A graphic plot 130 includes a horizontal axis 132 indicating frequency and a vertical axis 134 representing amplitude (in decibels; dB). A curve 136 represents a noise transfer function (NTF) relating to a second high pass filter in a sigma delta signal treating device, such as sigma delta signal treating apparatus 30 (FIG. 2).

A graphic plot 140 includes a horizontal axis 142 indicating frequency and a vertical axis 144 representing amplitude (in decibels; dB). A curve 146 represents a noise transfer function (NTF) representing the sum of NTFs 127, 136. A low pass filter unit (e.g., low pass filter unit 124; FIG. 2) may be employed to establish an expanded signal bandwidth $f_0$-$f_2$ where $f_2$>$f_1$, as indicated by a low pass filtering limit 148 establishing an expanded band of interest $f_0$-$f_2$ associated with NTF 146. It is desirable that the band of interest be expanded still further than indicated by expanded band of interest $f_0$-$f_2$ associated with NTF 146.

Characteristics of interface units 38, 43, 53, 58, 78, 83, 93, 98 and other elements in sigma delta treating apparatus 30 will have significant impact upon the shapes of NTFs 127, 136, 146.

Figure 4:
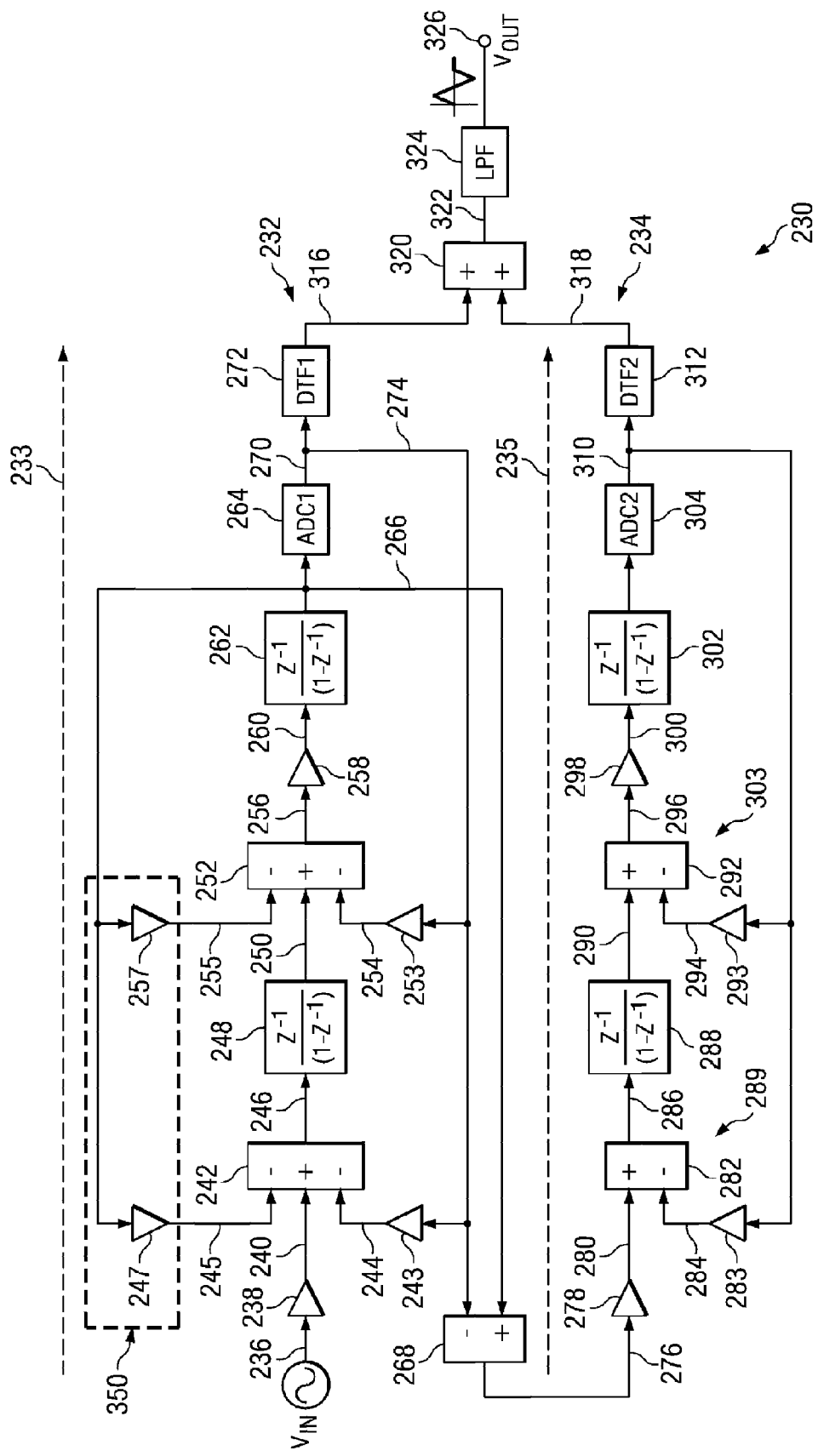
FIG. 4 is an electrical schematic diagram of a preferred embodiment of a sigma delta signal treating apparatus configured according to the teachings of the present invention.

FIG. 4 is an electrical schematic diagram of a preferred embodiment of a sigma delta signal treating apparatus configured according to the teachings of the present invention. In FIG. 4, a sigma delta signal treating apparatus 230 is configured as a fourth order two stage sigma delta modulator having a second order first stage 232 and a second order second stage 234. First stage 232 receives an analog input signal $V_{IN}$ at an input locus 236 to an interface unit 238. Interface unit 238 presents a treated input signal to a first input locus 240 of a first summing unit 242. First summing unit 242 sums signals received at first input locus 240 with signals received at a second inverting input locus 244 and with signals received at a third inverting input locus 245 to present a first summed signal at an input locus 246 of a first integrator unit 248. First integrator unit 248 integrates signals received at input locus 246 and presents a first integrated signal to a first input locus 250 of a second summing unit 252. Second summing unit 252 sums signals received at first input locus 250 with signals received at a second inverting input locus 254 and with signals received at a third inverting input locus 245 to present a second summed signal at an input locus 256 of an interface unit 258. Interface unit 258 presents a treated second summed signal to an input locus 260 of a second integrator unit 262. Second integrator unit 262 presents a second integrated signal to a first analog-to-digital converting (ADC1) unit 264 and presents the second integrated signal to a first input locus 266 of a third summing unit 268. Second integrator unit 262 also provides the second integrated signal to third inverting input locus 245 via an interface unit 247 and provides the second integrated signal to third inverting input locus 255 via an interface unit 257.

Any implementation of a notch filter may be employed and remain within the scope of the present invention. By way of further example and not by way of limitation, notch filter 350 may be implemented by eliminating feedback to third input locus 255 of summing unit 252 and introducing a delay in feedback to second input locus 254 of summing unit 252. By way of yet another example and not by way of limitation, notch filter 350 may be implemented without employing feedback to third input locus 254.

ADC1 264 presents a first digital signal to an input locus 270 to a first digital transfer function (DTF1) unit 272. ADC1 264 also provides the first digital signal to a second inverting input locus 274 to third summing unit 268. ADC1 264 further provides the first digital signal to second inverting input locus 244 via an interface unit 243 and provides the first digital signal to second inverting input locus 254 via an interface unit 253.

Third summing unit 268 sums signals received at first input locus 266 with signals received at a second inverting input locus 274 to present a third summed signal at an input locus 276 of an interface unit 278. Interface unit 278 presents a treated input signal to a first input locus 280 of a fourth summing unit 282. Fourth summing unit 282 sums signals received at first input locus 280 with signals received at a second inverting input locus 284 to present a fourth summed signal at an input locus 286 of a third integrator unit 288. Third integrator unit 288 integrates signals received at input locus 286 and presents a third integrated signal to a first input locus 290 of a fifth summing unit 292. Fifth summing unit 292 sums signals received at first input locus 290 with signals received at a second inverting input locus 294 to present a fifth summed signal at an input locus 296 of an interface unit 298. Interface unit 298 presents a treated fifth summed signal to an input locus 300 of a fourth integrator unit 302. Fourth integrator unit 302 presents a fourth integrated signal to a second analog-to-digital converting (ADC2) unit 304. ADC2 304 presents a second digital signal to an input locus 310 to a second digital transfer function (DTF2) unit 312. ADC2 304 also provides the second digital signal to second inverting input locus 284 via an interface unit 283 and provides the second digital signal to second inverting input locus 294 via an interface unit 293.

Digital transfer function unit 272 presents a modified first digital signal to a first input locus 316 of a sixth summing unit 320. Digital transfer function unit 312 presents a modified second digital signal to a second input locus 318 of sixth summing unit 320. Sixth summing unit 320 sums signals received at first input locus 316 with signals received at a second input locus 318 to present a sixth summed signal at an output locus 322.

By way of example and not by way of limitation, interface units 238, 243, 247, 253, 257, 258, 278, 283, 293, 298, may be configured as resistor elements, capacitor elements, inductor elements or a combination of such elements or other elements. Signal treating apparatus 230 thus establishes a signal path 233 from input locus 236 via interface unit 238, summing unit 242, integrator unit 248, summing unit 252, interface unit 258, integrator unit 262, ADC1 264, DTF1 272, summing unit 320 and low pass filter unit 324 to output locus 326. ADC1 264 is a source of quantization noise. Summing unit 268 operates to present quantization noise generated by ADC1 264 to input locus 276. Thus apparatus 230 establishes a quantization noise path 235 from input locus 276 via interface unit 278, summing unit 282, integrator unit 288, summing unit 292, interface unit 298, integrator unit 302, ADC2 304, DTF2 312, summing unit 320 and low pass filter unit 324 to output locus 326. ADC2 312 is also a source of quantization noise. ADC2 304 also provides the second digital signal to second inverting input locus 284 via an interface unit 283 and provides the second digital signal to second inverting input locus 294 via an interface unit 293.

Interface units 278, 298, 283, 293 and integrator units 288, 302 are preferably configured to establish a high pass filtering treatment of quantization noise traversing quantization noise path 235. Feeding back of the second digital signal permits configuring integrator unit 288 for cooperation with interface unit 283 to establish a first high pass filter unit 289 for performing a first high pass filtering treatment of quantization noise signals traversing quantization signal path 235, and permits configuring integrator unit 302 for cooperation with interface units 293, 298 to establish a second high pass filter unit 303 for performing a second high pass filtering treatment of quantization noise signals traversing quantization noise path 235.

Interface units 247, 257 coupled with summing units 242, 253 in first stage 230 establishes a notch filter 350. Notch filter 350 is effectively included in quantization noise path 235 because it affects quantization noise contributed by ADC1 264 by moving noise generated by ADC1 264 to higher frequencies. In this manner notch filter 350 shapes quantization noise contributed by ADC1 264.

Figure 5:
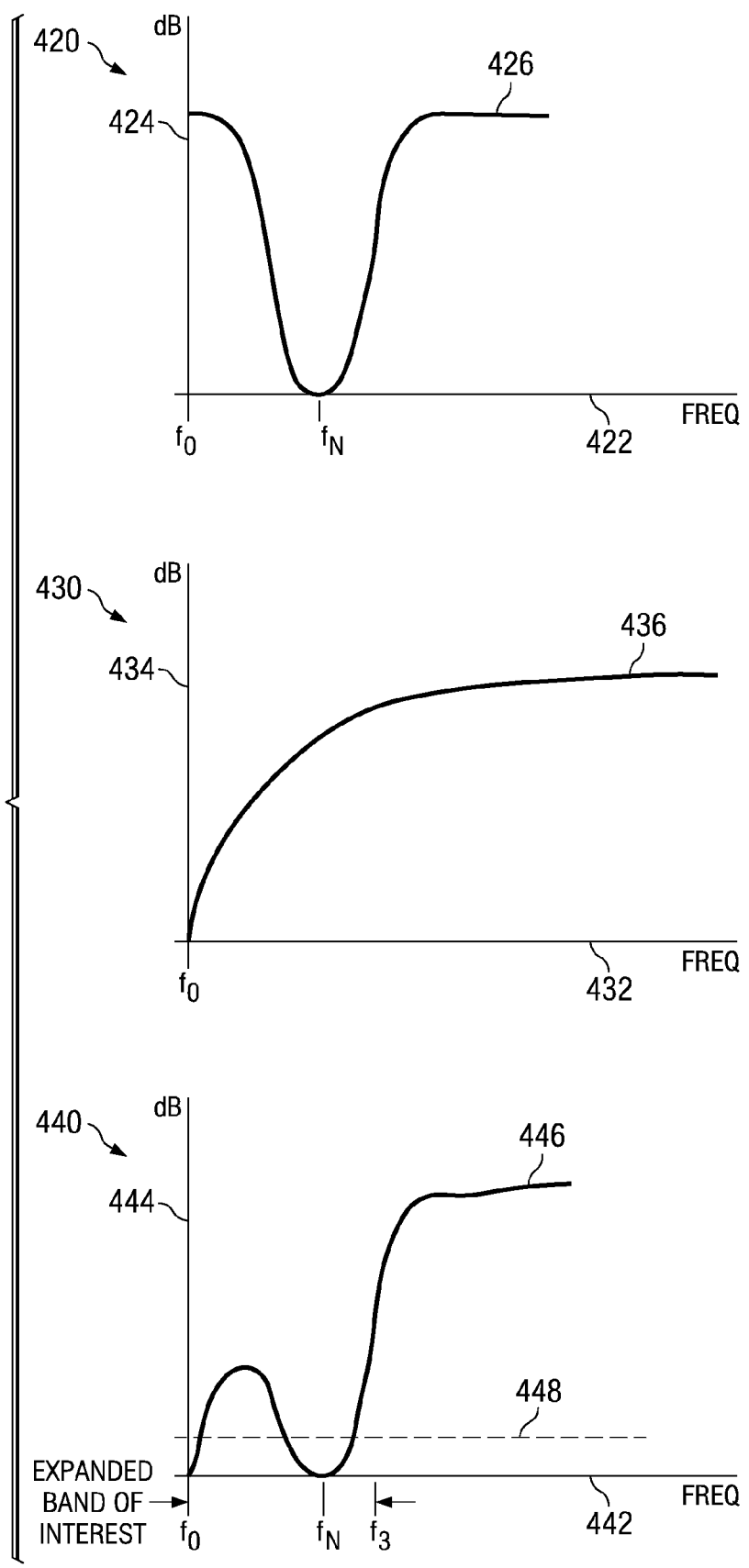
FIG. 5 is a graphic representation of various signals occurring in the prior art apparatus illustrated in FIG. 4.

FIG. 5 is a graphic representation of various signals occurring in the prior art apparatus illustrated in FIG. 4. In FIG. 5, a graphic plot 420 includes a horizontal axis 422 indicating frequency and a vertical axis 424 representing amplitude (in decibels; dB). A curve 426 represents a noise transfer function (NTF) relating to a notch filter in a sigma delta signal treating device, such as sigma delta signal treating apparatus 230 (FIG. 4). A notch or signal rejection response is established by the notch filter substantially centered about a notch frequency $f_N$ as indicated by NTF 426.

A graphic plot 430 includes a horizontal axis 432 indicating frequency and a vertical axis 434 representing amplitude (in decibels; dB). A curve 436 represents a noise transfer function (NTF) relating to a high pass filter in a sigma delta signal treating device, such as sigma delta signal treating apparatus 230 (FIG. 4).

A graphic plot 440 includes a horizontal axis 442 indicating frequency and a vertical axis 444 representing amplitude (in decibels; dB). A curve 446 represents a noise transfer function (NTF) representing the sum of NTFs 426, 436. A low pass filter unit (e.g., low pass filter unit 324; FIG. 4) may be employed to establish an expanded signal bandwidth $f_0$-$f_3$, where $f_3$>$f_N$, as indicated by a low pass filtering limit 448 establishing an expanded band of interest band of interest $f_0$-$f_3$ associated with NTF 446. Proper design of notch filters and high pass filters in sigma delta signal treating apparatus 230 (FIG. 4) may establish frequency $f_3$ at a higher value than frequency $f_2$ of expanded band of interest $f_0$-$f_2$ associated with prior art sigma delta signal treating apparatuses, such as sigma delta signal treating apparatus 30 (FIG. 2).

Characteristics of interface units 238, 243, 247, 253, 257, 258, 278, 283, 293, 298 and other elements in sigma delta treating apparatus 230 will have significant impact upon the shapes of NTFs 426, 436, 446.

Figure 6:
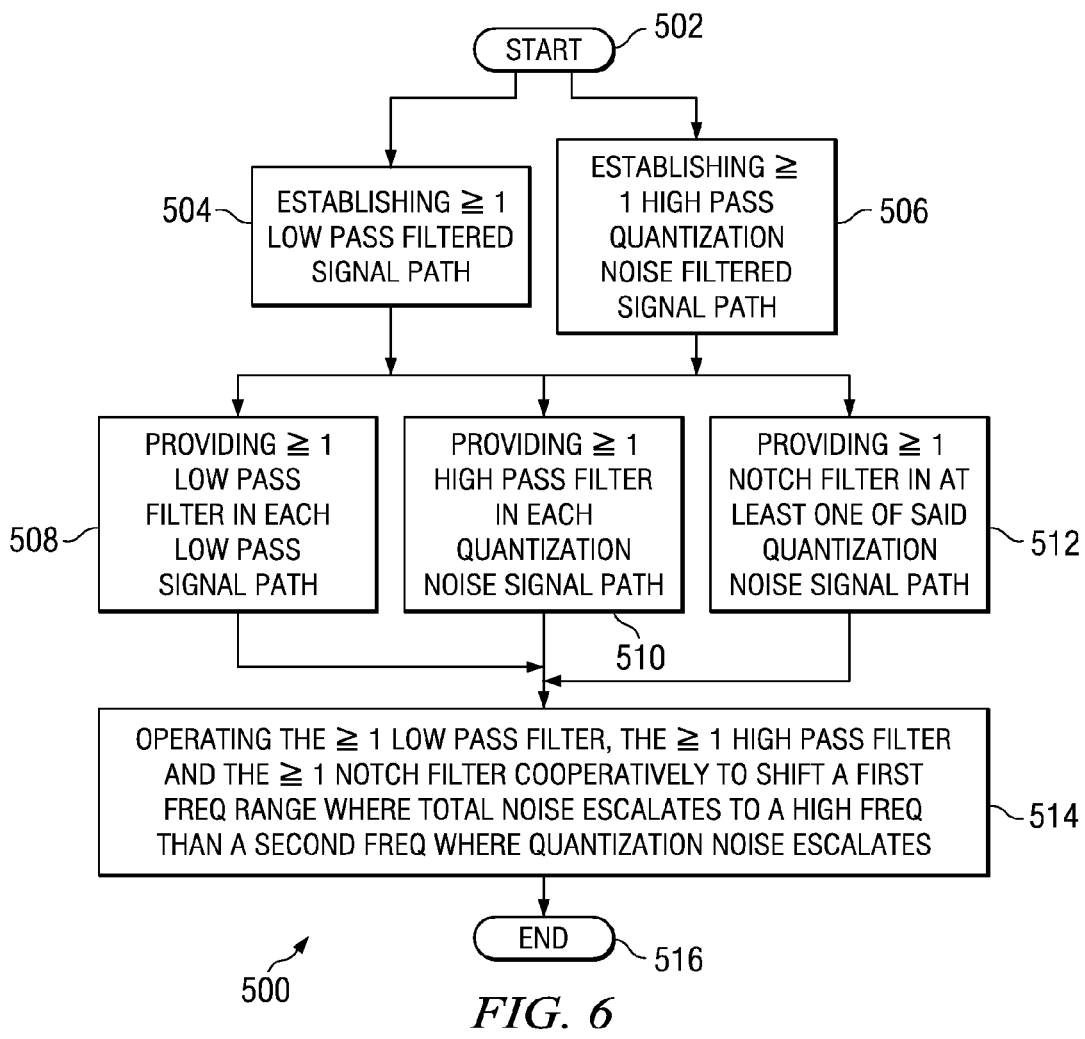
FIG. 6 is a flow diagram illustrating the method of the present invention.

FIG. 6 is a flow diagram illustrating the method of the present invention. In FIG. 6, a method 500 for effecting sigma delta signal treatment begins at a START locus 502. Method 500 continues with the steps of, in no particular order: (1) establishing at least one low pass filtered signal path, as indicated by a block 504; and (2) establishing at least one quantization noise filtered signal path coupled with the at least one low pass filtered signal path, as indicated by a block 506.

Method 500 continues with the steps of, in no particular order: (1) providing at least one low pass filter in each respective low pass filtered signal path of the at least one low pass filtered signal path, as indicated by a block 508; (2) providing at least one high pass filter in each respective quantization noise filtered signal path of the at least one quantization noise filtered signal path, as indicated by a block 510; and (3) providing at least one notch filter in at least one selected quantization noise filtered signal path of the at least one quantization noise filter signal path, as indicated by a block 512.

Method 500 continued with operating the at least one low pass filter, the at least one high pass filter and the at least one notch filter cooperatively to shift a first frequency range at which total noise begins to escalatingly increase to a higher frequency than a second frequency range at which quantization noise alone begins to escalatingly increase, as indicated by a block 514. Method 500 terminates at an END locus 516.

It is to be understood that, while the detailed drawings and specific examples given describe preferred embodiments of the invention, they are for the purpose of illustration only, that the apparatus and method of the invention are not limited to the precise details and conditions disclosed and that various changes may be made therein without departing from the spirit of the invention which is defined by the following claims.

We claim:

1. A sigma delta signal treating apparatus comprising:
   (a) a low pass filtered signal path including at least one low pass filter; and
   (b) a quantization noise filtered signal path coupled with said low pass filtered signal path; said quantization noise filtered path including at least one high pass filter and at least one feedback notch filter;
   wherein said at least one feedback notch filter is configured to establish a notch signal filtering effect substantially at a frequency range at which noise in the apparatus begins to escalatingly increase.

2. A sigma delta signal treating apparatus as recited in claim 1 wherein the apparatus is configured as a second order sigma delta signal treating apparatus; said second order apparatus comprising a plurality of low pass filtered signal paths and a plurality of quantization noise filtered signal paths; each respective low pass filtered signal path of said plurality of low pass filtered signal paths including at least one low pass filter; each respective quantization noise filtered signal path of said plurality of quantization noise filtered signal paths including at least one high pass filter and at least one feedback notch filter.

3. A sigma delta signal treating apparatus as recited in claim 2 wherein said at least one high pass filter and said at least one feedback notch filter cooperate to shift a first frequency range at which total noise in the apparatus begins to escalatingly increase to a higher frequency range than a second frequency range at which quantization noise alone in the apparatus begins to escalatingly increase.

4. A sigma delta signal treating apparatus comprising:
   (a) a low pass filtered signal path including at least one low pass filter; and
   (b) a quantization noise filtered signal path coupled with said low pass filtered signal path; said quantization noise filtered path including at least one high pass filter and at least one feedback notch filter;
   wherein said at least one low pass filter, said at least one high pass filter and said at least one feedback notch filter cooperate to shift a first frequency range at which total noise in the apparatus begins to escalatingly increase to a higher frequency range than a second frequency range at which quantization noise alone in the apparatus begins to escalatingly increase.

5. A sigma delta signal treating apparatus comprising:
(a) at least one low pass filtered signal path; each respective low pass filtered signal path of said at least one low pass filtered signal path including at least one low pass filter; and
(b) at least one quantization noise filtered signal path coupled with said at least one low pass filtered signal path; each respective quantization noise filtered path of said at least one quantization noise filtered signal path including at least one high pass filter; at least one selected quantization noise filtered signal path of said at least one quantization noise filtered signal path including at least one feedback notch filter;
wherein said at least one feedback notch filter is configured to establish a notch signal filtering effect substantially at a frequency range at which noise in the apparatus begins to escalatingly increase.

6. A sigma delta signal treating apparatus as recited in claim 5 wherein said at least one low pass filter, said at least one high pass filter and said at least one feedback notch filter cooperate to shift a first frequency range at which total noise in the apparatus begins to escalatingly increase to a higher frequency range than a second frequency range at which quantization noise alone in the apparatus begins to escalatingly increase.

7. A sigma delta signal treating apparatus comprising:
(a) at least one low pass filtered signal path; each respective low pass filtered signal path of said at least one low pass filtered signal path including at least one low pass filter; and
(b) at least one quantization noise filtered signal path coupled with said at least one low pass filtered signal path; each respective quantization noise filtered path of said at least one quantization noise filtered signal path including at least one high pass filter; at least one selected quantization noise filtered signal path of said at least one quantization noise filtered signal path including at least one feedback notch filter;
wherein said at least one low pass filter, said at least one high pass filter and said at least one feedback notch filter cooperate to shift a first frequency range at which total noise in the apparatus begins to escalatingly increase to a higher frequency range than a second frequency range at which quantization noise alone in the apparatus begins to escalatingly increase.

8. A method for effecting sigma delta signal treatment comprising the steps of:
(a) in no particular order:
(1) establishing at least one low pass filtered signal path; and
(2) establishing at least one quantization noise filtered signal path coupled with said at least one low pass filtered signal path; and
(b) in no particular order:
(1) providing at least one low pass filter in each respective low pass filtered signal path of said at least one low pass filtered signal path;
(2) providing at least one high pass filter in each respective quantization noise filtered signal path of said at least one quantization noise filtered signal path; and
(3) providing at least one feedback notch filter in at least one selected quantization noise filtered signal path of said at least one quantization noise filter signal path; and
(c) operating said at least one low pass filter, said at least one high pass filter and said at least one feedback notch filter cooperatively to shift a first frequency range at which total noise begins to escalatingly increase to a higher frequency than a second frequency range at which quantization noise alone begins to escalatingly increase.

9. A method for effecting sigma delta signal treatment as recited in claim 8 wherein said at least one selected quantization noise filtered signal path is each respective quantization noise filtered signal path of said at least one quantization noise filtered signal path.

10. A method for effecting sigma delta signal treatment as recited in claim 8 wherein said at least one feedback notch filter is configured to establish a notch signal filtering effect substantially at a frequency range at which noise in the apparatus begins to escalatingly increase.

11. A method for effecting sigma delta signal treatment as recited in claim 9 wherein said at least one feedback notch filter is configured to establish a notch signal filtering effect substantially at a frequency range at which noise in the apparatus begins to escalatingly increase.

* * * * *